United States Patent [19]

Walls

[11] Patent Number: 5,275,907
[45] Date of Patent: Jan. 4, 1994

[54] PHOTOSENSITIVE COMPOSITIONS AND LITHOGRAPHIC PRINTING PLATES CONTAINING ACID-SUBSTITUTED TERNARY ACETAL POLYMER AND COPOLYESTER WITH REDUCED PROPENSITY TO BLINDING

[75] Inventor: John E. Walls, Fort Collins, Colo.

[73] Assignee: Eastman Kodak Company, Rochester, N.Y.

[21] Appl. No.: 918,868

[22] Filed: Jul. 23, 1992

[51] Int. Cl.$^5$ .................. G03F 7/021; G03F 7/09
[52] U.S. Cl. ..................... 430/157; 430/175; 430/176; 430/278; 430/302; 430/908; 430/909
[58] Field of Search ............... 430/175, 176, 157, 278, 430/302, 908, 909

[56] References Cited

U.S. PATENT DOCUMENTS

| | | | |
|---|---|---|---|
| 4,652,604 | 3/1987 | Walls et al. | 522/63 |
| 4,741,985 | 5/1988 | Aoai et al. | 430/175 |
| 4,940,646 | 7/1990 | Pawlowski | 430/175 |
| 5,045,432 | 9/1991 | West et al. | 430/302 |
| 5,053,315 | 10/1991 | West et al. | 430/278 |
| 5,061,600 | 10/1991 | West et al. | 430/302 |
| 5,219,699 | 6/1993 | Walls et al. | 430/156 |

FOREIGN PATENT DOCUMENTS 1274017 5/1972 United Kingdom .

Primary Examiner—Charles L. Bowers, Jr.
Assistant Examiner—Christopher G. Young
Attorney, Agent, or Firm—Alfred P. Lorenzo

[57] ABSTRACT

Photosensitive compositions, useful in lithographic printing plates which can be developed with aqueous developing solutions, comprise a diazo resin, an acid-substituted ternary acetal polymer, and a copolyester of an unsaturated dicarboxylic acid and an oxyalkylene ether of an alkylidene diphenol. The acid-substituted ternary acetal polymers are comprised of recurring units which include three six-membered cyclic acetal groups, one of which is unsubstituted or substituted with an alkyl or hydroxyalkyl group, another of which is substituted with an aromatic or heterocyclic moiety, and a third of which is substituted with an acid group, an acid-substituted alkyl group or an acid-substituted aryl group.

27 Claims, No Drawings

PHOTOSENSITIVE COMPOSITIONS AND LITHOGRAPHIC PRINTING PLATES CONTAINING ACID-SUBSTITUTED TERNARY ACETAL POLYMER AND COPOLYESTER WITH REDUCED PROPENSITY TO BLINDING

CROSS-REFERENCE TO RELATED APPLICATIONS

Photosensitive compositions and lithographic printing plates containing acid-substituted ternary acetal polymers are disclosed and claimed in copending commonly assigned U.S. patent application Ser. No. 738,088, filed Jul. 30, 1991, "Photosensitive Compositions And Lithographic Printing Plates Containing Acid-Substituted Ternary Acetal Polymers" by John E. Walls and Larry D. LeBoeuf and issued Jun. 15, 1993, as U.S. Pat. No. 5,219,699.

A novel developer that is especially useful with the improved lithographic printing plates of this invention is disclosed and claimed in copending commonly assigned U.S. patent application Ser. No. 918,988, filed Jul. 23, 1992, "Aqueous Developer For Lithographic Printing Plates With Improved Desensitizing Capability" by John E. Walls, Gary R. Miller and Raymond W. Ryan, Jr.

Development of the improved lithographic printing plates of this invention by use of the novel developer of the aforesaid U.S. patent application Ser. No. 918,988 is disclosed and claimed in copending commonly assigned U.S. patent application Ser. No. 918,869, filed Jul. 23, 1992, "Method For Developing Lithographic Printing Plates" by John E. Walls, Gary R. Miller and Raymond W. Ryan, Jr.

FIELD OF THE INVENTION

This invention relates in general to novel photosensitive compositions and in particular to the use of such photosensitive compositions in lithographic printing plates. More specifically, this invention relates to photosensitive compositions comprising a diazo resin, an acetal polymer and an unsaturated polyester and to lithographic printing plates comprising an imaging layer formed from such photosensitive compositions.

BACKGROUND OF THE INVENTION

It is well known to prepare photosensitive compositions comprising a photosensitive agent and a polymeric binder and to utilize such compositions in the preparation of lithographic printing plates which can be developed with aqueous neutral or alkaline developing solutions. In such compositions, it is common practice to utilize a diazo resin as the photosensitive agent. The lithographic printing plates typically comprise a metal substrate, such as a substrate of anodized aluminum, which is coated with a photosensitive composition comprising the diazo resin, the polymeric binder and other ingredients such as colorants, stabilizers, exposure indicators, surfactants, and the like.

Many different polymers have been proposed for use as binders in the aforesaid photosensitive compositions. Particular advantages have been achieved by the use of acetal polymers as described, for example, in U.S. Pat. Nos. 4,652,604, 4,741,985, and 4,940,646.

In U.S. Pat. No. 4,652,604, the acetal polymer contains acetal groups of three types, namely six-membered cyclic acetals, five-membered cyclic acetals and intermolecular acetals. In U.S. Pat. No. 4,741,985, the acetal polymer is a mono-acetal containing a six-membered cyclic acetal group. In U.S. Pat. No. 4,940,646, the acetal polymer contains vinyl acetal units derived from an aldehyde that contains hydroxyl groups.

Acetal polymers can be advantageously utilized in lithographic printing plates in which the layer containing the acetal polymer and the diazo resin is the sole radiation-sensitive layer. They can also be usefully employed in so-called "dual layer" plates. In this type of lithographic printing plate, a radiation-sensitive layer containing a diazo resin is coated over an anodized aluminum support and a radiation-sensitive layer containing a photocross-linkable polymer is coated over the layer containing the diazo resin. Such dual layer plates are described, for example, in British Patent No. 1,274,017. They are advantageous in that radiation-sensitive layers containing diazo resins adhere much more strongly to most anodized aluminum supports than do radiation-sensitive layers containing photocrosslinkable polymers. Thus, the enhanced performance provided by photocrosslinkable polymers is achieved without sacrificing the excellent adhesive properties of diazo resin compositions.

Copending commonly assigned U.S. patent application Ser. No. 738,088 filed Jul. 30, 1991, "Photosensitive Compositions And Lithographic Printing Plates Containing Acid-Substituted Ternary Acetal Polymers" by John E. Walls and Larry D. LeBoeuf describes an important advance in the art relating to the use of acetal polymers in radiation-sensitive compositions and lithographic printing plates. The novel acetal polymers described in this patent application are acid-substituted ternary acetal polymers exhibiting improved properties in comparison with previously known acetal polymers.

More specifically, the acid-subsituted ternary acetal polymers described in the aforesaid copending patent application Ser. No. 738,088 are polymers with recurring units represented by the formula:

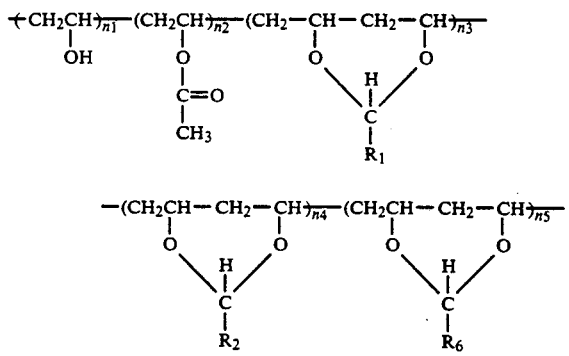

wherein $R_1$ is $-H$, $-C_nH_{2n+1}$ or $-C_2H_{2n}-OH$
where n = 1-12

$R_2$ is

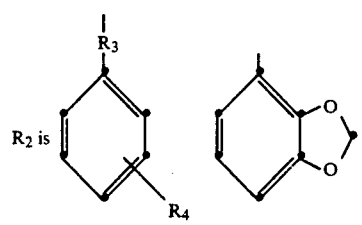

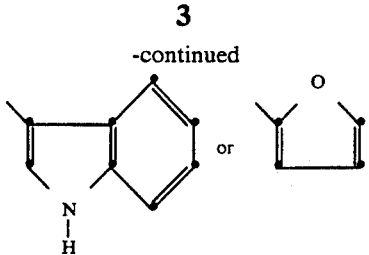

where $R_3$ is $-(CH_2)_x-$ or $-(CH_2)_m-CH(CH_2)_p-$
$\qquad\qquad\qquad\qquad\qquad\qquad\quad |$
$\qquad\qquad\qquad\qquad\qquad\qquad (CH_2)_y$
$\qquad\qquad\qquad\qquad\qquad\qquad\quad |$
$\qquad\qquad\qquad\qquad\qquad\qquad\quad CH_3$ and $x = 0-8$
$m = 0-8$
$y = 0-8$
$p = 0-8$

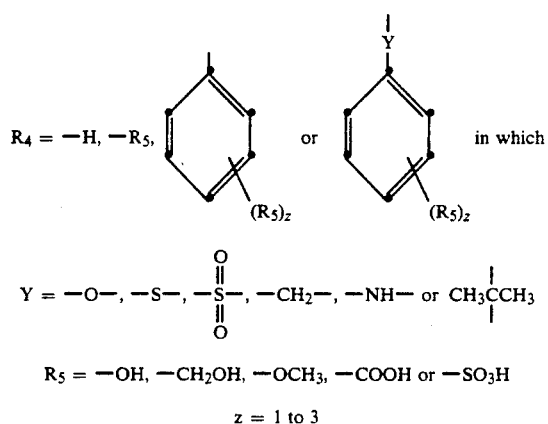

$R_4 = -H, -R_5,$ (structure) or (structure) in which $Y = -O-, -S-, -\overset{O}{\underset{O}{\overset{\|}{S}}}-, -CH_2-, -NH-$ or $CH_3\overset{|}{\underset{|}{C}}CH_3$ $R_5 = -OH, -CH_2OH, -OCH_3, -COOH$ or $-SO_3H$ $z = 1$ to $3$

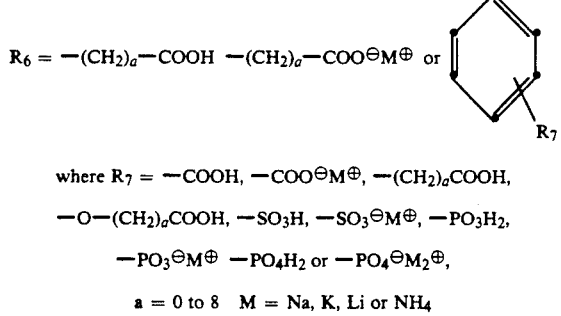

$R_6 = -(CH_2)_a-COOH \quad -(CH_2)_a-COO^\ominus M^\oplus$ or (phenyl structure with $R_7$)

where $R_7 = -COOH, -COO^\ominus M^\oplus, -(CH_2)_aCOOH,$ $-O-(CH_2)_aCOOH, -SO_3H, -SO_3^\ominus M^\oplus, -PO_3H_2,$ $-PO_3^\ominus M^\oplus \quad -PO_4H_2$ or $-PO_4^\ominus M_2^\oplus,$ $a = 0$ to $8 \quad M = Na, K, Li$ or $NH_4$ and
$n_1 = 0-25$ mole %, preferably 3 to 15 mole %
$n_2 = 2-25$ mole %, preferably 5 to 15 mole %
$n_3 = 10-70$ mole %, preferably 15 to 50 mole %
$n_4 = 10-60$ mole %, preferably 12 to 45 mole %
$n_5 = 10-45$ mole %, preferably 15 to 30 mole %

As indicated by the above structural formula, the acid-substituted ternary acetal polymers can be tetramers, in which the recurring unit comprises a vinyl acetate moiety and first, second and third cyclic acetal groups, or pentamers in which the recurring unit comprises a vinyl alcohol moiety, a vinyl acetate moiety and first, second, and third cyclic acetal groups.

All three of the acetal groups are six-membered cyclic acetal groups, one of them is unsubstituted or substituted with an alkyl or hydroxyalkyl group, another is substituted with an aromatic or heterocyclic moiety, and a third is substituted with an acid group, an acid-substituted alkyl group or an acid-substituted aryl group.

The acid-substituted ternary acetal polymers described above provide lithographic printing plates characterized by improved abrasion-resistance, improved resistance to chemical attack, extended press performance and enhanced rollup properties in comparison with the acetal polymers of the prior art. Lithographic printing plates utilizing the acid-substituted ternary acetal polymers described above as polymeric binders also have the important advantage that they can be processed in aqueous alkaline developing solutions containing very low concentrations of organic solvents. This is highly advantageous in view of the high costs and environmental concerns associated with the use of organic solvents. Since the acid-substituted ternary acetal polymers are fully soluble in aqueous alkaline developing solutions, they avoid the problems encountered with binders that cause the coating to break-up in particulate form.

While the acid-substituted ternary acetal polymers described above provide many important advantages in the manufacture of lithographic printing plates, they suffer from the disadvantage that the ability of the printing plate to resist blinding is not as good as is desired. In the lithographic printing plate art, the term "blinding" refers to inability to adequately take up the printing ink and agents which enhance ink receptivity are often used to avoid or decrease blinding.

More specifically, blinding is an erratic phenomenon occurring during the printing process where the image, in part or totally, loses the ability to carry any or all of the ink being applied. Blinding has been one of the most frustrating and nebulous anomalies pressmen have had to cope with in the printing process. Numerous studies and resulting presentations, papers and articles have been devoted to the subject. The transition to aqueous plates, recycled paper, environmentally safer fountain solutions and less expensive inks have exacerbated the issue of blinding. Present aqueous products are inherently less ink receptive than their solvent processable forerunners. The changes in ink, paper and fountain solution coupled with changes in press design aimed at increased running speeds have created a combination of conditions favorable for permitting blinding. Typically, calcium and barium salts are known to support the occurrence of blinding. This stems from components in the ink being extracted and interacting with components in the fountain solution and/or ink to form hydrophilic salts that either chemically or physcially become part of the image.

Certain polyvinyl acetals, for example, commercially available FORMVAR and BUTVAR resins, are less susceptible to blinding than the above-described acid-substituted ternary acetal polymers. However, the problem with these resins is that a developer with a high content of organic solvent must be used. Particulate development and the drawbacks associated therewith are then encountered. The goal is to achieve a system in which the coating is inherently highly oleophilic, develops in a dissolving manner and is capable of use with a developer having a maximum content of water.

It is toward the objective of providing improved photosensitive compositions and improved lithographic printing plates, capable of effectively meeting the needs of the lithographic printing plate art, that the present invention is directed.

SUMMARY OF THE INVENTION

In one embodiment, the present invention is directed to a photosensitive composition comprising a diazo resin, an acid-substituted ternary acetal polymer of the structure described above and an unsaturated polyester. In a second embodiment, the invention is directed to a lithographic printing plate comprising an imaging layer formed from this photosensitive composition.

Incorporation of an unsaturated polyester, as hereinafter described, in the imaging layer of a lithographic printing plate comprising a diazo resin and an acid-substituted ternary acetal polymer has been found to provide a substantial and unexpected improvement in the properties of the plate and especially in regard to reduced tendency to the occurrence of blinding.

For the purposes of this invention, the useful unsaturated polyesters are copolyesters of an unsaturated dicarboxylic acid and an oxyalkylene ether of an alkylidene diphenol.

DESCRIPTION OF THE PREFERRED EMBODIMENTS

The photosensitive compositions and lithographic printing plates of this invention can contain any of the diazo resins known to be useful in lithographic printing plates. These include, for example, the condensation product of p-diazo diphenyl amine and paraformaldehyde, the condensation product of 3-methoxy-4-diazo diphenylamine and paraformaldehyde, and the diazo resins of U.S. Pat. Nos. 2,063,631, 2,667,415, 2,667,498, 2,922,715, 2,946,683, 3,050,502, 3,163,633, 3,227,074, 3,311,605, 3,406,159, 3,679,419, 3,849,392 and 3,867,147.

The diazo resin is typically employed in an amount of about 20 to about 70 percent by weight of the photosensitive layer, more preferably in an amount of about 30 to about 60 percent by weight, and most preferably in an amount of about 40 to about 55 percent by weight. The acid-substituted ternary acetal polymer is typically employed in an amount of about 20 to about 75 percent by weight of the photosensitive layer, more preferably in an amount of about 30 to about 60 percent by weight, and most preferably in an amount of about 35 to about 50 percent by weight. The unsaturated polyester is typically employed in an amount of from about 5 to about 40 percent by weight of the photosensitive layer, more preferably in an amount of about 8 to about 30 percent by weight, and most preferably in an amount of about 10 to about 20 percent by weight.

The acid-substituted ternary acetal polymers can be prepared by hydrolyzing polyvinyl acetate, or by starting with partially hydrolyzed polyvinyl acetate, i.e. polyvinyl alcohol, and reacting it with three different aldehydes to thereby form a ternary acetal. Suitable techniques for forming polymers of this type are known to those skilled in the art. Thus, for example, the ternary acetal polymers can be prepared by an emulsion condensation wherein, as the solubility of the starting material changes from water-soluble to solvent-soluble as a result of the formation of the acetal groups, the product forms an emulsion because of its lack of solubility in water. In this method, the particles are prevented from aggregating by use of a surfactant.

An alternative method is to compensate for the change in solubility of the starting material from water-soluble to solvent-soluble by maintaining a homogeneous solution through the continual addition of an appropriate solvent. In the former process, the precipitated particles are filtered, washed and dried. In the latter process, the reaction solution is added to water and mixed in a blender or homogenizer to precipitate the resin product and create particles of the desired size.

The acetalization is catalyzed by the use of an organic or inorganic acid in an amount that will effectively allow protonation to occur, but will not significantly alter the final product by causing unwanted hydrolysis of the acetal groups.

Examples of suitable aldehydes useful in preparing the first cyclic acetal group of the acid-substituted ternary acetal polymers described herein include:
formaldehyde
acetaldehyde
propionaldehyde
n-butyraldehyde
isobutyraldehyde
4-hydroxybutyraldehyde
n-valeraldehyde
5-hydroxyvaleraldehyde
n-caproaldehyde
n-heptaldehyde
and the like.

Examples of suitable aldehydes useful in preparing the second cyclic acetal group of the acid-substituted ternary acetal polymers described herein include:
2-phenyl propionaldehyde
3-phenyl butyraldehyde
benzaldehyde
2-hydroxy benzaldehyde
4-hydroxy benzaldehyde
2,4-dihydroxy benzaldehyde
cinnamaldehyde
hydrocinnamaldehyde
biphenyl carboxaldehyde
indole carboxaldehyde
salicylaldehyde
piperonal
furfural
and the like.

Examples of suitable aldehydes useful in preparing the third cyclic acetal group of the acid-substituted ternary acetal polymers described herein include:
2-formyl phenoxy acetic acid
glyoxylic acid
semisuccinaldehyde
4-formyl phenoxy acetic acid
2-carboxybenzaldehyde
4-carboxybenzaldehyde
2-formyl phenoxy sulfonic acid
2-formyl phenoxy phosphonic acid
and the like.

An especially preferred acid-substituted ternary acetal polymer for use in this invention comprises about 3 mole % of vinyl alcohol moieties, about 12 mole % of vinyl acetate moieties, about 48 mole % of cyclic, acetal moieties derived by reaction with propionaldehyde, about 12 mole % of cyclic acetal moieties derived by reaction with 3-phenyl butyraldehyde, and about 25 mole % of cyclic acetal moieties derived by reaction with 2-formyl phenoxy acetic acid.

Another especially preferred acid-substituted ternary acetal polymer for use in this invention comprises about 7 mole % of vinyl alcohol moieties, about 12 mole % of vinyl acetate moieties, about 17 mole % of cyclic acetal moieties derived by reaction with n-butyraldehyde, about 34 mole % of cyclic acetal moieties derived by reaction with benzaldehyde and about 30 mole % of cyclic acetal moieties derived by reaction with glyoxylic acid.

Polyvinyl alcohols suitable for use as starting materials in preparing the acid-substituted ternary acetal polymers are well known commercially available materials. They preferably have an average molecular weight in the range of from about 3,000 to about 120,000. Examples of suitable polyvinyl alcohols include those available in a range of molecular weights from AIR PRODUCTS CORPORATION under the trademarks AIRVOL 203, AIRVOL 205, AIRVOL 523 and AIRVOL 540. Other suitable polyvinyl alcohols include those available from HOECHST-CELANESE under the trademarks MOWIOL 4-88, MOWIOL 5-88, MOWIOL 18-88, MOWIOL 26-88, and MOWIOL 40-88.

As indicated hereinabove, the radiation-sensitive compositions of this invention include an unsaturated polyester as well as an acid-substituted ternary acetal polymer. The unsaturated polyester employed in this invention is a copolyester of an unsaturated dicarboxylic acid such as fumaric acid or maleic acid, or mixtures thereof, and an oxyalkylene ether of an alkylidene diphenol. A typical example is the copolyester of fumaric acid which has the formula:

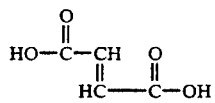

and polyoxypropylene-2,2'-bis(4-hydroxyphenyl)propane which has the formula:

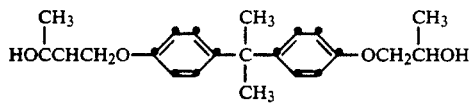

Such copolyesters are well known in the art and are described, for example, in British Patents 722,264, 722,265, 722,266 and 722,273. They are available commercially from Reichhold Chemicals, Inc., as ATLAC 382E BISPHENOL FUMARATE RESIN (also known as ATLAC 32-629-00) and related resins ATLAC 382.05 (a solution of ATLAC 382E in styrene), ATLAC 32-631-000 (also known as ATLAC 382ES), ATLAC 32-628-00 (also known as ATLAC 382A) and ATLAC 32-630-00 (also known as ATLAC 382ESA); from CARGILL INC. as CARGILL 51-5184 resin and CARGILL 74-7451 resin; and from UNION CAMP CORPORATION as UNIREZ 1042 resin.

To prepare the unsaturated polyester, an alkylene oxide, such as propylene oxide, is condensed with an alkylidene diphenol such as bisphenol-A, to give the bis-hydroxyalkyl derivative which, in turn, is reacted with an unsaturated acid, such as fumaric acid, to give the unsaturated polyester.

As described in British Patent No. 722,264, the suitable oxyalkylene ethers of an alkylidene diphenol can be generically represented by the formula:

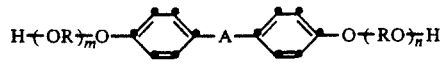

wherein A is a 2-alkylidene radical of 3 or 4 carbon atoms, R is an alkylene radical of 2 or 3 carbon atoms, m and n are each at least one and the sum of m and n is not greater than 3. The esterifying dicarboxylic acid is predominantly fumaric acid, or maleic acid or mixtures thereof, but may include minor proportions of saturated aliphatic acids, aromatic acids or other unsaturated aliphatic acids, such as, for example, succinic acid, sebacic acid, phthalic acid or itaconic acid.

Copolyesters of an unsaturated discarboxylic acid and an oxyalkylene ether of an alkylidene diphenol have been found to be especially useful in alleviating problems of blinding that can occur with lithographic printing plates containing an acid-substituted ternary acetal polymer. They provide enhanced properties in this regard without significantly detracting from other important characteristics of the composition. Certain other polymers evaluated were found to also alleviate the blinding problem to some extent but to introduce one or more undesirable features. Examples of such polymers are homoacetals, polyvinyl acetates, epoxies, acrylates and urethanes.

The unsaturated polyesters utilized herein have been employed heretofore in lithographic printing plates, for example, in the printing plates described in U.S. Pat. Nos. 5,045,432, 5,053,315 and 5,061,600 but use thereof in combination with acid-substituted ternary acetal polymers is neither disclosed nor suggested in the prior art.

In addition to a diazo resin, the acid substituted ternary acetal polymer and the unsaturated polyester, the imaging layer of the lithographic printing plate can optionally contain a variety of other ingredients such as colorants, stabilizers, exposure indicators and surfactants. Particularly useful colorants are pigments, including phthalocyanine, anthraquinone and quinacridone pigments. The pigment selected should be one which contains a minimal amount of heavy metal and which forms a stable dispersion with the acid-substituted ternary acetal binder resin. Useful amounts of pigment are from about 1 to about 20 percent by weight of the photosensitive layer, more preferably from about 2 to about 12 percent by weight, and most preferably from about 4 to about 8 percent by weight. Effective stabilizers include both organic and inorganic acids, preferably citric, phosphoric, ascorbic or tartaric acids. Useful amounts of acid are from about 2 to about 6 percent by weight of the photosensitive layer, more preferably from about 2.5 to about 5 percent by weight, and most preferably from about 3 to about 4 percent by weight. Useful exposure indicators are dyes which are pH sensitive and which do not couple with diazonium compounds. Examples of such dyes include eosin, azobenzene, Victoria Blue, 4-phenylazo diphenylamine, methyl violet and phenolphthalein. Useful amounts of the dye are from about 0.01 to about 3 percent by weight of the photosensitive layer, more preferably from about 0.05 to about 2 percent by weight, and most preferably from about 0.1 to about 1 percent by weight. Useful surfactants include fluorocarbon surfactants, such as FC-430 surfactant from 3M Corporation or Zonyl NS surfactant from DuPont, and silicone surfactants such as Silwet L-7606 surfactant from Union Carbide Corporation or BYK 306 surfactant from BYK CHEMIE. The surfactant is used in an amount of from about 0.1 to about 4 percent by weight of the photosensitive layer, more preferably from about 0.5 to about 2.5 percent by weight, and most preferably from about 1 to about 2 percent by weight.

In forming the photosensitive layer, the diazo resin, the acid-substituted ternary acetal polymer, the unsaturated polyester and the optional ingredients are dispersed in a suitable solvent or mixture of solvents. Particularly useful solvents include 2-methoxyethanol and the acetate thereof, 1-methoxy-2-propanol and the acetate thereof, 2-ethoxyethanol and the acetate thereof, toluene, diisobutyl ketone, butyrolactone, N-methyl pyrrolidone, methyl lactate, ethyl acetate, dimethyl formamide, tetrahydrofuran, methylethyl ketone and butyl acetate.

The support for the lithographic printing plate is typically formed of aluminum which has been grained, for example by electrochemical graining, and then anodized, for example, by means of anodizing techniques employing sulfuric acid and/or phosphoric acid. Methods of both graining and anodizing are very well known in the art and need not be further described herein.

As previously indicated hereinabove, the acid-substituted ternary acetal polymers and unsaturated polyesters described herein can be employed in dual layer lithographic printing plates in which a radiation-sensitive layer comprising a photocrosslinkable polymer is coated over a radiation-sensitive layer containing a diazo resin. Photocrosslinkable polymers which are particularly useful for this purpose are those containing the photosensitive group —CH=CH—CO— as an integral part of the polymer backbone, especially the p-phenylene diacrylate polyesters. These polymers are described, for example, in U.S. Pat. Nos. 3,030,208, 3,622,320, 3,702,765 and 3,929,489. A typical example of such a photocrosslinkable polymer is the polyester prepared from diethyl p-phenylenediacrylate and 1,4-bis(β-hydroxyethoxy)cyclohexane, which is comprised of recurring units of the formula:

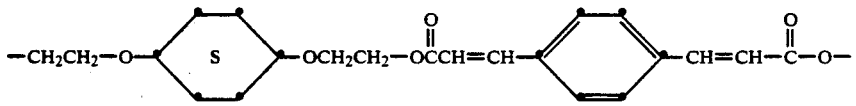

Other particularly useful polymers of this type are those which incorporate ionic moieties derived from monomers such as dimethyl-3,3'-[sodioimino]-disulfonyl]dibenzoate and dimethyl-5-sodiosulfoiso-phthalate. Examples of such polymers include poly[1,4-cyclohexylene-bis (oxyethylene)-p-phenylenediacrylate]-co-3,3'-(sodioimino)disulfonyl]dibenzoate and poly[1,4-cyclohexylene-bis (oxyethylene)-p-phenylenediacrylate]-co-3,3'-[(sodioimino)disulfonyl]-dibenzoate-co-3-hydroxyisophthalate.

The lithographic printing plates of this invention can be developed with any suitable aqueous developing solution. The exposed printing plate is developed by flushing, soaking, swabbing or otherwise treating the crosslinked radiation-sensitive composition with developing solution which selectively solubilizes (i.e., removes) the unexposed areas of the radiation-sensitive layer.

In developing the printing plates of this invention, it is especially preferred to utilize the aqueous developing composition disclosed in copending commonly assigned U.S. patent application Ser. No. 918,988, filed Jul. 23, 1992, "Aqueous Developer For Lithographic Printing Plates With Improved Desensitizing Capability" by John E. Walls, Gary R. Miller and Raymond W. Ryan, Jr. This developing composition is comprised of:

(1) an organic solvent,
(2) an anionic surface active agent,
(3) an alkali metal tetraborate oxalate or nitrate,
(4) an aliphatic monocarboxylic acid, preferably containing 6 to 22 carbon atoms,
(5) an aliphatic dicarboxylic acid, preferably containing 4 to 16 carbon atoms, and
(6) an alkaline buffering system in an amount sufficient to provide an alkaline pH.

The aqueous developing composition described above has many advantageous features. Thus, for example, it requires only a low concentration of organic solvent yet is highly effective in dissolution-type processing. It is highly resistant to oxidation. Most significantly, it is very effective in overcoming problems of excessive background sensitivity with the lithographic printing plates of this invention.

The function of the organic solvent is to assist in the removal of the non-exposed portions of the photosensitive coating. Any of a wide variety of solvents can be used, with those typically employed being high boiling liquids. The most preferred solvent is 2-phenoxy propanol due to its excellent solvent action and very low toxicity. Other suitable solvents include, but are not restricted to, 2-phenoxy ethanol, benzyl alcohol, N-methyl pyrrolidone, butyrolactone, propylene glycol monomethyl ether and the like. The organic solvent can be employed in the developing composition in an amount of from about 0.2 to about 16 weight percent, more preferably in an amount of from about 1 to about 10 weight percent, and most preferably in an amount of from about 2.5 to about 7 weight percent.

The anionic surface active agent serves to reduce the surface tension so as to facilitate better penetration of the developer into the coating as well as to provide some cleaning action and dispersion of the coating composition that is removed. Any of a wide variety of anionic surface active agents, especially sulfate and sulfonate alkyl and aryl alkyl anionic surface active agents, can be used. Sodium octyl sulfate is preferred. Other suitable anionic surface active agents include, but are not restricted to, potassium decyl sulfate, sodium toluene sulfonate, sodium xylene sulfonate, sodium dodecylbenzene sulfonate, potassium tridecylbenzene sulfonate, lithium dinonadecylbenzene sulfonate, sodium docosanylbenzene sulfonate, potassium methyl naphthalene sulfonate, lithium triethyl naphthalene sulfonate, sodium isopropyl naphthalene sulfonate, sodium diisopropyl naphthalene sulfonate, sodium dibutyl naphthalene sulfonate, and the like. The anionic surface active agent can be employed in the developing composition in an amount of from about 0.2 to about 15 weight percent, more preferably in an amount of about 0.8 to about 12 weight percent and most preferably in an amount of about 1.2 to about 8 weight percent.

The alkali metal tetraborate, oxalate or nitrate serves to elevate the activity of the developing composition, particularly as it relates to the desensitization of the background. Potassium tetraborate is preferred for this purpose but sodium tetraborate and lithium tetraborate are also useful, as are alkali metal oxalates and alkali metal nitrates. The alkali metal tetraborate, oxalate or nitrate can be employed in the developing composition in an amount of from about 0.01 to about 7 weight percent, more preferably in an amount of about 0.05 to about 5 weight percent, and most preferably in an amount of from about 0.1 to about 3 weight percent.

The function of the aliphatic monocarboxylic acid is to effectively remove diazo resin from the background areas as well as partially insolubilized diazo resin from and around the image area, thereby precluding or at least minimizing the possibility of "hot-spot" formation or halation. Preferred aliphatic monocarboxylic acids for this purpose are those containing 6 to 22 carbon atoms. The most preferred aliphatic monocarboxylic acid is nonanoic acid (also known as pelargonic acid). Other suitable aliphatic monocarboxylic acids include, but are not restricted to, hexanoic acid, octanoic acid, decanoic acid, undecanoic acid, dodecanoic acid, pentadecanoic acid, octadecanoic acid, eicosanoic acid, docosanoic acid, and the like. The aliphatic monocarboxylic acid can be employed in the developing composition in an amount of from about 0.5 to about 12 weight percent, more preferably in an amount of about 1.5 to about 10 weight percent, and most preferably in an amount of about 2.5 to about 8 weight percent.

The function of the aliphatic dicarboxcylic acid is to enhance the desensitization of both image and background areas. When both an aliphatic monocarboxylic acid and an aliphatic dicarboxylic acid are incorporated in the developer, the degree to which the background is cleaned is significantly and surprisingly improved in comparison with use of only an aliphatic monocarboxylic acid or only an aliphatic dicarboxylic acid. Preferred aliphatic dicarboxylic acids for this purpose are those containing 4 to 16 carbon atoms. The most preferred aliphatic dicarboxylic acid is sebacic acid. Other suitable aliphatic dicarboxylic acids include, but are not restricted to, succinic acid, glutaric acid, adipic acid, pimelic acid, suberic acid, azelaic acid, dodecanedioic acid, hexadecanedioic acid, and the like. The aliphatic dicarboxylic acid can be employed in the developing composition in an amount of from about 0.05 to about 10 weight percent, more preferably in an amount of about 0.2 to about 5 weight percent, and most preferably in amount of about 0.4 to about 3 weight percent.

Since the developing composition must be alkaline, salts of the acids are employed to formulate the developing composition or are formed in its manufacture. Potassium hydroxide is preferably used to form the potassium salts although sodium and lithium salts are also useful. Potassium carbonate is advantageously employed to provide the desired working pH and to impart buffering capability, but other common buffering agents, such as, for example, trisodium phosphate, disodium phosphate, sodium phthalate, sodium citrate, sodium ascorbate, and sodium tartrate can be used if desired.

The alkaline buffering system, for example, the combination of potassium hydroxide and potassium carbonate, can be utilized in any amount sufficient to provide an alkaline pH. The pH of the working strength developing composition is preferably in the range of from 8 to 12, more preferably in the range of 8.5 to 11, and most preferably in the range of 9 to 10. Suitable amounts of potassium hydroxide or other alkaline salt-forming agents are in the range of from about 0.1 to about 8 weight percent, more preferably in the range of about 0.05 to about 6 weight percent, and most preferably in the range of about 0.1 to about 3 weight percent. The potassium hydroxide or other alkaline agent, is preferably used only in the mole ratio required to form salts of the carboxylic acids or in just a slight excess over this amount.

In addition to the required ingredients specified above, various optional ingredients can also be included in the developing composition. A particularly useful optional ingredient is an antifoaming agent and particularly useful antifoaming agents are polydimethyl siloxanes such as BURST RSD-10 Antifoam which is commercially available from HYDROLABS Company, Wayne, N.J. The antifoam is preferably used in the developing composition in an amount in the range from about 0.001 to about 3 weight percent, more preferably in the range from about 0.005 to about 1 weight percent, and most preferably in the range of from about 0.01 to about 0.5 weight percent.

The invention is further illustrated by the following examples of its practice.

Examples 1 to 4 are comparative examples which demonstrate the results obtained when operating outside of the scope of the present invention. Examples 5 to 8 are examples of the invention and demonstrate the unexpected advantages achieved thereby.

EXAMPLE 1 (COMPARATIVE)

50.0 grams of AIRVOL 205 polyvinyl alcohol (an 88% hydrolyzed polyvinyl acetate having an average molecular weight of about 25,000) were added to a closed reaction vessel fitted with a water-cooled condensing column, followed by the addition of 150 grams of demineralized water and 300 grams of n-propanol. With continual stirring, the mixture was cooked at 70° C. for 20 hours. After this time, the temperature was adjusted to 60° C. and 6.8 grams of concentrated hydrochloric acid was added. Over a 2 hour period, an admixture consisting of 15.05 grams of n-butyraldehyde and 10.76 grams of benzaldehyde was slowly and uniformly added in a dropwise manner. Upon complete addition of the mixture of aldehydes, the reaction was continued at 60° C. for an additional 2 hours, and then 9.99 grams of glyoxylic acid were added and the reaction was continued for an additional 3 hours. At this point, potassium carbonate was added until a pH of $7.0 \pm 0.5$ was obtained. The neutralized reaction mixture was then added to 4.0 liters of demineralized water to precipitate the polymer product. Vigorous shear mixing was provided to form small particles as well as to remove the n-propanol and neutralization by-products. The polymer was then vacuum filtered and similarly washed two more times. After the third wash, the product was filtered and dried at 40° C. for 24 hours. 74.5 grams of polymer was obtained for a 95.8% yield. The structure of the polymer was in accordance with the structural formula provided hereinabove in which the $R_1$ group is derived from n-butyraldehyde and has the formula $-CH_2CH_2-CH_3$, the R2 group is derived from benzaldehyde and has the formula

the $R_6$ is derived from glyoxylic acid and has the formula —COOH,
the value of $n_1$ is 7 mole %, the value of $n_2$ is 12 mole %, the value of $n_3$ is 17 mole %, the value of $n_4$ is 34 mole % and the value of $n_5$ is 30 mole %.

The acid-substituted ternary acetal polymer prepared as described above was utilized in preparing a radiation-sensitive coating composition of the following formulation:

| Component | Weight % |
|---|---|
| Acid-substituted ternary acetal polymer | 2.40 |
| Diazo resin* | 2.20 |
| Pigment (Hostapern Blue B2G) | 0.40 |
| Phosphoric acid | 0.20 |
| 4-Phenylazodiphenylamine | 0.01 |
| 2-Methoxyethanol | 81.25 |
| Butyrolactone | 13.50 |
| Surfactant (BYK 306) | 0.04 |
| | 100.00 |

*Condensation product of 3-methoxy-4-diazo diphenyl amine sulfate and an isomeric mixture of methoxymethyl substituted diphenyl ethers isolated as the diisopropylnaphthalene sulfonate salt.

The radiation-sensitive coating composition was filtered and coated on the surface of an aluminum support which had been electrochemically grained, anodized and conditioned with a silicate barrier layer. After drying of the radiation-sensitive layer was completed, a portion of the printing plate was overlaid with a negative test target, exposed, developed and finished in accordance with conventional practice. Using a sheet-fed press equipped with a conventional dampening system and a commercially available process black ink, the printing plate was run until image wear was observed. Solid areas became worn first, and were considered unacceptable at 305,000 impressions. Such performance is considered to be good.

To evaluate the blinding resistance, two plates were identically prepared and run on a press as described above. Rather than run the plates to breakdown, they were run to 5,000 impressions. At this point, one plate was treated with LPC. LPC is a highly alkaline, strong-solvent-containing plate cleaner which is effective in cleaning the background of a plate but is capable of causing slow roll-up or even permanent blinding on the image. This is particularly true of aqueous plates. LPC is manufactured by Printers Service, Newark, N.J. The other plate was cleaned with POLYMATIC Plate Preserver which is manufactured by Eastman Kodak Company, Rochester, N.Y. Both cleaned plates were rolled up. The number of sheets required until acceptable print quality was achieved was counted. The plate treated with POLYMATIC Plate Preserver had acceptable print quality and density at the 12th sheet. The plate treated with LPC required 186 sheets to achieve acceptable print quality and density. This is unacceptable performance.

Another test was run under commercial conditions. The heretofore described plate was properly exposed and processed. It was mounted on a four-color Man Roland web press, using the standard conditions which consist of Prisco 2351 fountain solution and four process color inks from Printing Ink, Inc. The job was run at 45,000 impressions per hour. The magenta plate became partially blind at 67,000 impressions. It was cleaned and run for an additional 10,000 impressions before it became blind again. The plate was removed and replaced with a new plate.

EXAMPLE 2 (COMPARATIVE)

In like manner as described in Example 1, an acid-substituted ternary acetal polymer was prepared for subsequent use in a coating solution. In the present instance, AIRVOL 523 was substituted for AIRVOL 205, acetaldehyde was substituted for the n-butyraldehyde, 2,4-dihydroxybenzaldehyde was substituted for the benzaldehyde and semisuccinaldehyde was substituted for the glyoxylic acid.

The acid-substituted ternary acetal polymer was utilized in the preparation of a coating solution as described in Example 1.

The radiation-sensitive coating composition was filtered and coated on the surface of an aluminum support which had been electrochemically grained, anodized and conditioned with a silicate barrier layer. After drying of the radiation-sensitive layer was completed, a portion of the printing plate was overlaid with a negative test target, exposed, developed and finished in accordance with conventional practice. Using a sheet-fed press equipped with a conventional dampening system and a commercially available process black ink, the printing plate was run until image wear was observed. Solid areas became worn first, and were considered unacceptable at 415,000 impressions.

Further, and in like manner as described in Example 1, a blinding test was conducted using LPC. The plate treated with POLYMATIC Plate Preserver was observed to have acceptable print density and quality at 10 sheets. The plate treated with LPC required 240 sheets before acceptable print quality was obtained. From the foregoing, it is seen that under normal sheet-fed printing conditions, the performance is good. There is however a tendency to blind under extreme conditions.

A web-press evaluation was not conducted.

EXAMPLE 3 (COMPARATIVE)

In like manner as described in Example 1, an acid-substituted ternary acetal polymer was prepared for subsequent use in a coating solution. In the present instance, AIRVOL 203 was substituted for AIRVOL 205, propionaldehyde was substituted for the n-butyraldehyde, 3-phenylbutyraldehyde was substituted for the benzaldehyde and 2-formylphenoxyacetic acid was substituted for the glyoxylic acid.

The acid-substituted ternary acetal polymer was utilized in the preparation of a coating solution as described in Example 1.

The radiation-sensitive coating composition was filtered and coated on the surface of an aluminum support which had been electrochemically grained, anodized and conditioned with a silicate barrier layer. After drying of the radiation-sensitive layer was completed, a portion of the printing plate was overlaid with a negative test target, exposed, developed and finished in accordance with conventional practice. Using a sheet-fed press equipped with a conventional dampening system and a commercially available process black ink, the printing plate was run until image wear was observed. Solid areas became worn first, and were considered unacceptable at 505,000 impressions.

Further, and in like manner as described in Example 1, a blinding test was conducted using LPC. The plate treated with POLYMATIC Plate Preserver was observed to have acceptable print quality and density at 8 sheets. The plate treated with LPC required 162 sheets before acceptable print quality was obtained. There was also a portion of the image that remained blind through an additional 1000 impressions, at which point the test was discontinued.

Another test was run under commercial conditions on a web press as described in Example 1. The magenta plate began to lose ink density at 36,000 impressions. The plate was cleaned and run for 8,000 impressions, at which point it was replaced. The cyan plate showed ink density loss at 82,000 impressions. It also was eventually replaced.

EXAMPLE 4 (COMPARATIVE)

In like manner as described in Example 1, an acid-substituted ternary acetal polymer was prepared for subsequent use in a coating solution. In the present instance, MOWIOL 5-88 was substituted for the AIR-VOL 205, n-valeraldehyde for the n-butyraldehyde, salicylaldehyde for the benzaldehyde and 4-carboxybenzaldehyde for the glyoxylic acid.

The acid-substituted ternary acetal polymer was utilized in the preparation of a coating solution as described in Example 1.

The radiation-sensitive coating composition was filtered and coated on the surface of an aluminum support which had been electrochemically grained, anodized and conditioned with a silicate barrier layer. After drying of the radiation-sensitive layer was completed, a portion of the printing plate was overlaid with a negative test target, exposed, developed and finished in accordance with conventional practice. Using a sheet-fed press equipped with a conventional dampening system and a commercially available process black ink, the printing plate was run until image wear was observed. Solid areas became worn first, and were considered unacceptable at 430,000 impressions.

Further, and in like manner as described in Example 1, a blinding test was conducted using LPC. The plate treated with POLYMATIC Plate Preserver was observed to have acceptable print quality and density at 10 sheets. The plate treated with LPC still had partial blinding at 1,000 impressions at which point the test was discontinued.

A web-press evaluation was not conducted.

EXAMPLE 5

The diazo resin described in Example 1 was used in the coating solution also described therein and a portion of the acid-substituted ternary acetal polymer was replaced with CARGILL 51-5184 resin manufactured and sold by CARGILL, INC., Wayzata, Minn., according to the following formulation:

| Ingredient | Weight % |
| --- | --- |
| Diazo resin | 2.20 |
| Phosphoric acid | 0.20 |
| Butyrolactone | 13.50 |
| Acid-substituted ternary acetal polymer of Example 1 | 1.80 |
| CARGILL 51-5184 Resin | 0.60 |
| Pigment (Hostapern Blue B2G) | 0.40 |
| 4-Phenylazodiphenylamine | 0.01 |
| Surfactant (BYK 306) | 0.04 |
| 2-Methoxy ethanol | 81.25 |
| | 100.00 |

The radiation-sensitive coating composition was filtered and coated on the surface of an aluminum support which had been electrochemically grained, anodized and conditioned with a silicate barrier layer. After drying of the radiation-sensitive layer was completed, a portion of the printing plate was overlaid with a negative test target, exposed, developed and finished in accordance with conventional practice. Using a sheet-fed press equipped with a conventional dampening system and a commercially available process black ink, the printing plate was run until image wear was observed. Solid areas became worn first, and were considered unacceptable at 320,000 impressions.

In comparison to Example 1, it is seen that the addition of the unsaturated polyester, i.e., CARGILL 51-5184 resin, did not adversely impact on press performance. It was also noted that photosensitivity and development were not influenced perceptibly.

To evaluate blinding, two plates were prepared identically and run on a press as described above. One plate was coated with the formulation of Example 1, while the other was coated with the formulation of the present example. LPC was used as detailed in Example 1. The plate from Example 1 again required an excessive quantity of sheets until acceptable print quality and density were obtained. 177 sheets were printed before this point was reached. The plate containing the unsaturated polyester in accordance with this invention had acceptable print quality and density by the 8th sheet.

Further, and as described in Example 1, a test was run under commercial conditions. This time a plate representative of Example 1 was run in comparison to a plate made according to the present example. The plate representative of Example 1 blinded at 82,000 impressions. The plate representative of this example ran without problems and completed the job of 1.2 million impressions.

EXAMPLE 6

A plate was prepared from a coating solution exactly as described in Example 5 except that the CARGILL 51-5184 resin was replaced with UNI-REZ 1042 resin manufactured and sold by Union Camp, Jacksonville, Fla. The acid-substituted ternary acetal polymer was replaced by the polymer described in Example 2.

The radiation-sensitive coating composition was filtered and coated on the surface of an aluminum support which had been electrochemically grained, anodized and conditioned with a silicate barrier layer. After drying of the radiation-sensitive layer was completed, a portion of the printing plate was overlaid with a negative test target, exposed, developed and finished in accordance with conventional practice. Using a sheet-fed press equipped with a conventional dampening system and a commercially available process black ink, the printing plate was run until image wear was observed. Solid areas became worn first, and were considered unacceptable at 405,000 impressions, thereby showing no loss of press performance in comparison to Example 2.

In like manner as described in Example 1, a blinding test was conducted by comparing the plate described in Example 2 to the plate of the present example. The plate from Example 2 required 275 sheets before acceptable print quality and density were obtained. The plate of the present example gave acceptable print quality and density at the 10th sheet.

The web press evaluation was not conducted

EXAMPLE 7

A plate was prepared from a coating solution exactly as described in Example 5 except that the CARGILL 51-5184 resin was replaced with ATLAC 382.05 resin manufactured and sold by Reichhold Chemicals, Inc., Durham, N.C. The acid-substituted ternary acetal polymer was replaced with the polymer described in Example 3.

The radiation-sensitive coating composition was filtered and coated on the surface of an aluminum support which had been electrochemically grained, anodized and conditioned with a silicate barrier layer. After drying of the radiation-sensitive layer was completed, a portion of the printing plate was overlaid with a negative test target, exposed, developed and finished in accordance with conventional practice. Using a sheet-fed press equipped with a conventional dampening system and a commercially available process black ink, the printing plate was run until image wear was observed. Solid areas became worn first, and were considered unacceptable at 490,000 impressions, thereby showing no loss of press performance in comparison with Example 3.

In like manner as described in Example 1, a blinding test was conducted by comparing the plate described in Example 3 to the plate of the present example. The plate from Example 3 required 180 sheets before acceptable print quality and density were obtained. The plate of the present example gave acceptable print quality and density at the 7th sheet.

Further, and as described in Example 1, a test was run under commercial conditions. This time a plate representative of Example 3 was run in comparison to a plate made according to the present example. The plate representative of Example 3 began to blind at 45,000 impressions. The plate representative of this example ran without problems and completed the job of 1.4 million impressions.

EXAMPLE 8

A plate was prepared from a coating solution exactly as described in Example 5 except that the CARGILL 51-5184 resin was replaced with CARGILL 74-7451 resin, manufactured and sold by CARGILL, INC., Wayzata, Minn. The acid-substituted ternary acetal polymer was replaced with the polymer described in Example 4.

The radiation-sensitive coating composition was filtered and coated on the surface of an aluminum support which had been electrochemically grained, anodized and conditioned with a silicate barrier layer. After drying of the radiation-sensitive layer was completed, a portion of the printing plate was overlaid with a negative test target, exposed, developed and finished in accordance with conventional practice. Using a sheet-fed press equipped with a conventional dampening system and a commercially available process black ink, the printing plate was run until image wear was observed. Solid areas became worn first, and were considered unacceptable at 435,000 impressions, thereby showing no loss of press performance in comparison to Example 4.

In like manner as described in Example 1, a blinding test was conducted by comparing the plate described in Example 4 to the plate of the present example. The plate from Example 4 required 170 sheets before acceptable print quality and density were obtained. The plate of the present example gave acceptable print quality and density quality at the 11th sheet.

A web press evaluation was not conducted.

The invention has been described in detail, with particular reference to certain preferred embodiments thereof, but it should be understood that variations and modifications can be effected within the spirit and scope of the invention.

I claim:

1. A photosensitive composition comprising a mixture of (1) a diazo resin, (2) an acid-substituted ternary acetal polymer and (3) a copolyester of an unsaturated dicarboxylic acid and an oxyalkylene ether of an alkylidene diphenol; said acid-substituted ternary acetal polymer having recurring units represented by the formula:

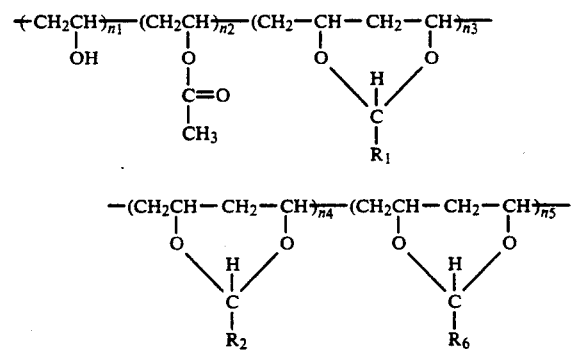

wherein $R_1$ is $-H$, $-C_nH_{2n+1}$ or $-C_2H_{2n}-OH$
where $n = 1-12$

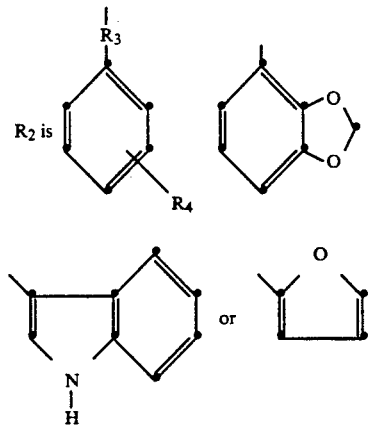

where $R_3$ is $\text{+CH}_2\text{+}_x$ or $\text{+CH}_2)_m-\text{CH(CH}_2\text{+}_p$
$(\text{CH}_2)_y$
$\text{CH}_3$ and
$x = 0-8$
$m = 0-8$ y=0-8
p=0-8

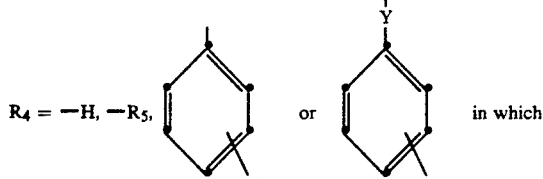

$Y = -O-, -S-, -\overset{\overset{O}{\|}}{\underset{\underset{O}{\|}}{S}}-, -CH_2-, -NH-$ or $CH_3\overset{\overset{|}{C}}{\underset{|}{C}}CH_3$ $R_5 = -OH, -CH_2OH, -OCH_3, -COOH$ or $-SO_3H$ z = 1 to 3

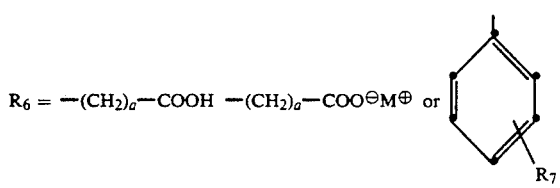

where $R_7 = -COOH, -COO^{\ominus}M^{\oplus}, -(CH_2)_aCOOH,$ $-O-(CH_2)_aCOOH, -SO_3H, -SO_3^{\ominus}M^{\oplus}, -PO_3H_2,$ $-PO_3^{\ominus}M^{\oplus}\ -PO_4H_2$ or $-PO_4^{\ominus}M_2^{\oplus},$ a = 0 to 8   M = Na, K, Li or NH$_4$ and
$n_1$ = 0–25 mole %
$n_2$ = 2–25 mole %
$n_3$ = 10–70 mole %
$n_4$ = 10–60 mole %
$n_5$ = 10–45 mole %.

2. A photosensitive composition as claimed in claim 1 wherein $n_1$ is equal to 3 to 15 mole %, $n_2$ is equal to 5 to 15 mole %, $n_3$ is equal to 15 to 50 mole %, $n_4$ is equal to 12 to 45 mole % and $n_5$ is equal to 15 to 30 mole %.

3. A photosensitive composition as claimed in claim 1 wherein $R_1$ is $-H, -CH_2CH_3, -CH_2CH_2CH_3, -(CH_2)_3CH_3,$ $-CH_2-\overset{\overset{CH_3}{|}}{\underset{\underset{CH_3}{|}}{CH}}, -(CH_2)_4CH_3$ or $-(CH_2)_6CH_3.$ 4. A photosensitive composition as claimed in claim 1 wherein $R_2$ is

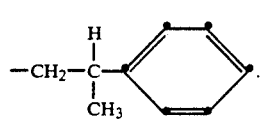

5. A photosensitive composition as claimed in claim 1 wherein $R_2$ is

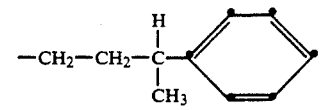

6. A photosensitive composition as claimed in claim 1 wherein $R_2$ is

7. A photosensitive composition as claimed in claim 1 wherein $R_6$ is

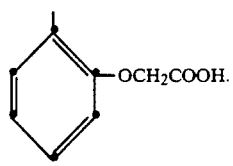

8. A photosensitive composition as claimed in claim 1 wherein $R_1$ is $-CH_2CH_3$

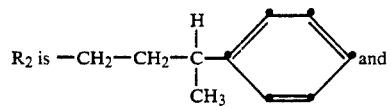 and

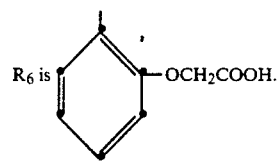

9. A photosensitive composition as claimed in claim 1 wherein said diazo resin is a condensation product of 3-methoxy-4-diazo diphenyl amine sulfate and an isomeric mixture of methoxymethyl substituted diphenyl ethers.

10. A photosensitive composition as claimed in claim 1 wherein said unsaturated dicarboxylic acid is selected from the group consisting of fumaric acid, maleic acid and mixtures thereof.

11. A photosensitive composition as claimed in claim 1, wherein said copolyester is a copolyester of fumaric acid and an oxyalkylene ether of an alkylidene diphenol of the formula:

wherein A is a 2-alkylidene radical of 3 or 4 carbon atoms, R is an alkylene radical of 2 or 3 carbon atoms, m and n are each at least one and the sum of m and n is not greater than 3.

12. A photosensitive composition as claimed in claim 1, wherein said copolyester is a copolyester of fumaric acid and polyoxypropylene-2,2'-bis(4-hydroxyphenyl)-propane.

13. A lithographic printing plate comprising a support having thereon a radiation-sensitive layer comprising (1) a diazo resin, (2) an acid-substituted ternary acetal polymer, and (3) a copolyester of an unsaturated dicarboxylic acid and an oxyalkylene ether of an alkylidene diphenol; said acid-substituted ternary acetal polymer having recurring units represented by the formula:

$$-(CH_2CH)_{n1}-(CH_2CH)_{n2}-(CH_2-CH-CH_2-CH)_{n3}-$$
$$\underset{OH}{|} \quad \underset{\underset{CH_3}{|}}{\overset{O}{\underset{|}{C=O}}} \quad \underset{\underset{R_1}{|}}{\overset{O}{\diagdown}\overset{}{\underset{H}{C}}\overset{}{\diagup}O}$$

$$-(CH_2CH-CH_2-CH)_{n4}-(CH_2CH-CH_2-CH)_{n5}-$$
$$\overset{O\diagdown\overset{H}{C}\diagup O}{\underset{R_2}{|}} \quad \overset{O\diagdown\overset{H}{C}\diagup O}{\underset{R_6}{|}}$$

wherein $R_1$ is $-H$, $-C_nH_{2n+1}$ or $-C_2H_{2n}-OH$ where $n = 1-12$ $R_2$ is

[benzene ring with $R_3$ and $R_4$ substituents]

[benzodioxole structure]

[indole structure with N-H] or [furan-like structure with O]

where $R_3$ is $-(CH_2)_x$ or $-(CH_2)_m-CH(CH_2)_p-$
$\underset{\underset{CH_3}{|}}{(CH_2)_y}$ and
x=0-8
m=0-8
y=0-8
p=0-8

$R_4 = -H, -R_5,$ [benzene ring with $(R_5)_z$] or [benzene ring with Y and $(R_5)_z$] in which -continued
$$Y = -O-, -S-, -\overset{\overset{O}{\|}}{\underset{\underset{O}{\|}}{S}}-, -CH_2-, -NH- \text{ or } CH_3\overset{|}{\underset{|}{C}}CH_3$$

$R_5 = -OH, -CH_2OH, -OCH_3, -COOH$ or $-SO_3H$ $z = 1$ to 3

$R_6 = -(CH_2)_a-COOH \quad -(CH_2)_a-COO^\ominus M^\oplus$ or [benzene ring with $R_7$]

where $R_7 = -COOH, -COO^\ominus M^\oplus, -(CH_2)_aCOOH,$
$-O-(CH_2)_aCOOH, -SO_3H, -SO_3^\ominus M^\oplus, -PO_3H_2$ or
$-PO_3^\ominus M^\oplus, -PO_4H_2$ or $-PO_4^\ominus M_2^\ominus,$ $a = 0$ to 8 $\quad M = Na, K, Li$ or $NH_4$ and
$n_1 = 0-25$ mole %
$n_2 = 2-25$ mole %
$n_3 = 10-70$ mole %
$n_4 = 10-60$ mole %
$n_5 = 10-45$ mole %.

14. A lithographic printing plate as claimed in claim 13 wherein $n_1$ is equal to 3 to 15 mole %, $n_2$ is equal to 5 to 15 mole %, $n_3$ is equal to 15 to 50 mole %, $n_4$ is equal to 12 to 45 mole % and $n_5$ is equal to 15 to 30 mole %.

15. A lithographic printing plate as claimed in claim 13 wherein $R_1$ is $-H, -CH_2CH_3, -CH_2CH_2CH_3, -(CH_2)_3CH_3,$
$\underset{\underset{CH_3}{|}}{-CH_2-\overset{\overset{CH_3}{|}}{C}H}, -(CH_2)_4CH_3$ or $-(CH_2)_6CH_3$.

16. A lithographic printing plate as claimed in claim 13 wherein $R_2$ is $-CH_2-\overset{\overset{H}{|}}{\underset{\underset{CH_3}{|}}{C}}-$ [benzene ring]

17. A lithographic printing plate as claimed in claim 13 wherein $R_2$ is $-CH_2-CH_2-\overset{\overset{H}{|}}{\underset{\underset{CH_3}{|}}{C}}-$ [benzene ring]

18. A lithographic printing plate as claimed in claim 13 wherein $R_2$ is

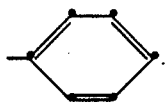

19. A lithographic printing plate as claimed in claim 13 wherein $R_6$ is

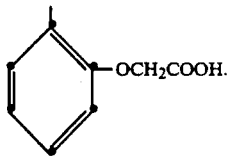

20. A lithographic printing plate as claimed in claim 13 wherein $R_1$ is $-CH_2CH_3$

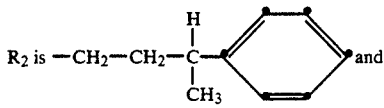

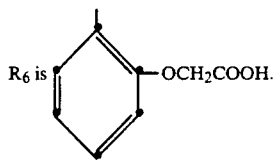

21. A lithographic printing plate as claimed in claim 13 wherein said diazo resin is a condensation product of 3- methoxy-4-diazo diphenylamine sulfate and an isomeric mixture of methoxymethyl substituted diphenyl ethers.

22. A lithographic printing plate as claimed in claim 13 wherein said support is comprised of grained and anodized aluminum.

23. A lithographic printing plate as claimed in claim 13 wherein said radiation-sensitive layer is comprised of about 40 to about 55 percent by weight of said diazo resin, about 35 to about 50 percent by weight of said acid-substituted ternary acetal polymer, and about 10 to about 20 percent by weight of said copolyester.

24. A lithographic printing plate as claimed in claim 13 wherein said radiation-sensitive layer additionally comprises about 2 to about 12 percent by weight of pigment, about 2.5 to about 5 percent by weight of an acid which functions as a stabilizer, about 0.05 to about 2 percent by weight of a dye which functions as an exposure indicator, and about 0.5 to about 2.5 percent by weight of a surfactant 25. A lithographic printing plate as claimed in claim 13, wherein said unsaturated dicarboxylic acid is selected from the group consisting of fumaric acid, maleic acid and mixtures thereof.

26. A lithographic printing plate as claimed in claim 13, wherein said copolyester is a copolyester of fumaric acid and an oxyalkylene ether of an alkylidene diphenol of the formula:

wherein A is a 2-alkylidene radical of 3 or 4 carbon atoms, R is an alkylene radical of 2 or 3 carbon atoms, m and n are each at least one and the sum of m and n is not greater than 3.

27. A lithographic printing plate as claimed in claim 13, wherein said copolyester is a copolyester of fumaric acid and polyoxypropylene-2,2'-bis(4-hydroxyphenyl)-propane.

* * * * *